(12) United States Patent
Chungpaiboonpatana et al.

(10) Patent No.: US 6,207,551 B1
(45) Date of Patent: Mar. 27, 2001

(54) METHOD AND APPARATUS USING FORMIC ACID VAPOR AS REDUCING AGENT FOR COPPER WIREBONDING

(75) Inventors: Surasit Chungpaiboonpatana, Irvine; Craig Davidson, Foothill Ranch, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/382,003

(22) Filed: Aug. 24, 1999

(51) Int. Cl.[7] .......................... H01L 21/44; H01L 21/48; H01L 21/50
(52) U.S. Cl. .......................... 438/617; 438/584; 438/612
(58) Field of Search ................................ 438/106, 584, 438/612, 613, 614, 617

(56) References Cited

U.S. PATENT DOCUMENTS 4,821,148 * 4/1989 Koboyashi et al. .
4,976,393 * 12/1990 Nakajima et al. .
5,249,733 * 10/1993 Brady et al. .

* cited by examiner

*Primary Examiner*—Kevin M. Picardat
*Assistant Examiner*—D. M. Collins
(74) *Attorney, Agent, or Firm*—Snell & Wilmer LLP

(57) ABSTRACT

A method and apparatus are disclosed for using formic acid vapor as a reducing agent during wirebonding operations to a semiconductor chip. The method and apparatus are particularly useful when wirebonding to copper metal pads. While maintaining a preferred reaction temperature between 190° C. and 210° C., a copper metal pad is exposed to formic acid vapor during wirebonding to remove copper oxidation from the pad to permit a good wirebond to be achieved. A less preferred reaction temperature range is 150° C. to 360° C.

In accordance with another aspect of the invention, the concentration of formic acid vapor is controlled by mixing formic acid vapor with a gas such as nitrogen that does not participate in the reduction chemical reactions. Reaction by-products, such as carbon monoxide and hydrogen gas, may be recirculated back to further participate in the reduction chemical reactions.

31 Claims, 3 Drawing Sheets

METHOD AND APPARATUS USING FORMIC ACID VAPOR AS REDUCING AGENT FOR COPPER WIREBONDING

BACKGROUND OF THE INVENTION

1. Technical Field

The present invention relates, generally, to semiconductor manufacturing processes and, more particularly, to wirebonding on copper metal pads during the packaging of semiconductor chips and the use of formic acid as a reducing agent during copper wirebonding.

2. Background Art and Technical Problems

In the past, semiconductor chips were typically manufactured with a top layer of aluminum metal to provide electrical interconnections among the devices (such as transistors) formed on (or in) the semiconductor chip. The metal layer would include pads which provided points where wires could be bonded to the chip to provide electrical connections to external circuits, as well as power and ground connections. Thus, suitable technology was developed for bonding wires to aluminum metal pads.

Copper now offers certain advantages as a metal layer for semiconductor manufacturing. However, problems have arisen when attempts have been made to bond wires to copper metal pads. A very short time after the copper metal layer is deposited on a semiconductor chip, a thin layer of copper oxidation forms on the surface of the metal. For purposes of this discussion, "copper oxidation" is used generically to refer to various species of insulative copper compounds that form in reaction to atmosphere or other gasses to which the copper surface is typically exposed, including but not necessarily limited to, CuO, $Cu_2O_3$, $CuSO_4$, to obtain a good electrical connection by wire bonding to the copper pad.

In the past, a wire would be vibrated at high frequencies to break up the layer of aluminum oxide that would typically form on aluminum metal pads. However, such techniques prove to be ineffective when used during copper wire bonding. Vibrations are effective when used to break up aluminum oxide, because aluminum oxide tends to be brittle. Copper oxidation does not have the same characteristics.

Attempts to clean the surface of copper pads to permit wire bonding to be performed have also been ineffective. The copper oxidation layer grows back too quickly. Thus, even if the copper surface can be cleaned, the copper oxidation layer will usually grow back before wire bonding can be achieved.

Efforts to achieve wire bonding to copper metalization have included sputtering a layer of aluminum over the copper metal. Other alternatives have included sputtering or otherwise depositing a layer of nichol-gold, or a layer of nichol-lead-gold. While such techniques may result in some success at wire bonding, each of these is such a high cost solution that it has proven to be less than satisfactory in practice. A lower cost solution is needed.

Therefore, with the development of semiconductor chip designs employing copper metalization, a cost effective method for effectively wire bonding to copper pads is needed.

SUMMARY OF THE INVENTION

In accordance with an exemplary embodiment of the present invention, formic acid vapor is used as a reducing agent during copper wire bonding to remove copper oxidation and to permit an effective bond and good electrical connection to be achieved. In a preferred exemplary embodiment, the reaction temperature during wire bonding (wile the formic acid vapor is being used as a reducing agent) is maintained at a temperature between 150° C. and 360° C., more preferably between 150° C. and 250° C., and even more preferably between 190° C. and 210° C. By-products of the chemical reactions during reduction, such as carbon monoxide (CO) and hydrogen gas ($H_2$), are preferably recirculated back to the work piece to further participate in reduction reactions.

BRIEF DESCRIPTION OF THE DRAWINGS

The present invention will hereinafter be described in conjunction with the appended drawing figures, wherein like numerals denote like elements, and.

DETAILED DESCRIPTION OF PREFERRED EXEMPLARY EMBODIMENTS

Figure 1:
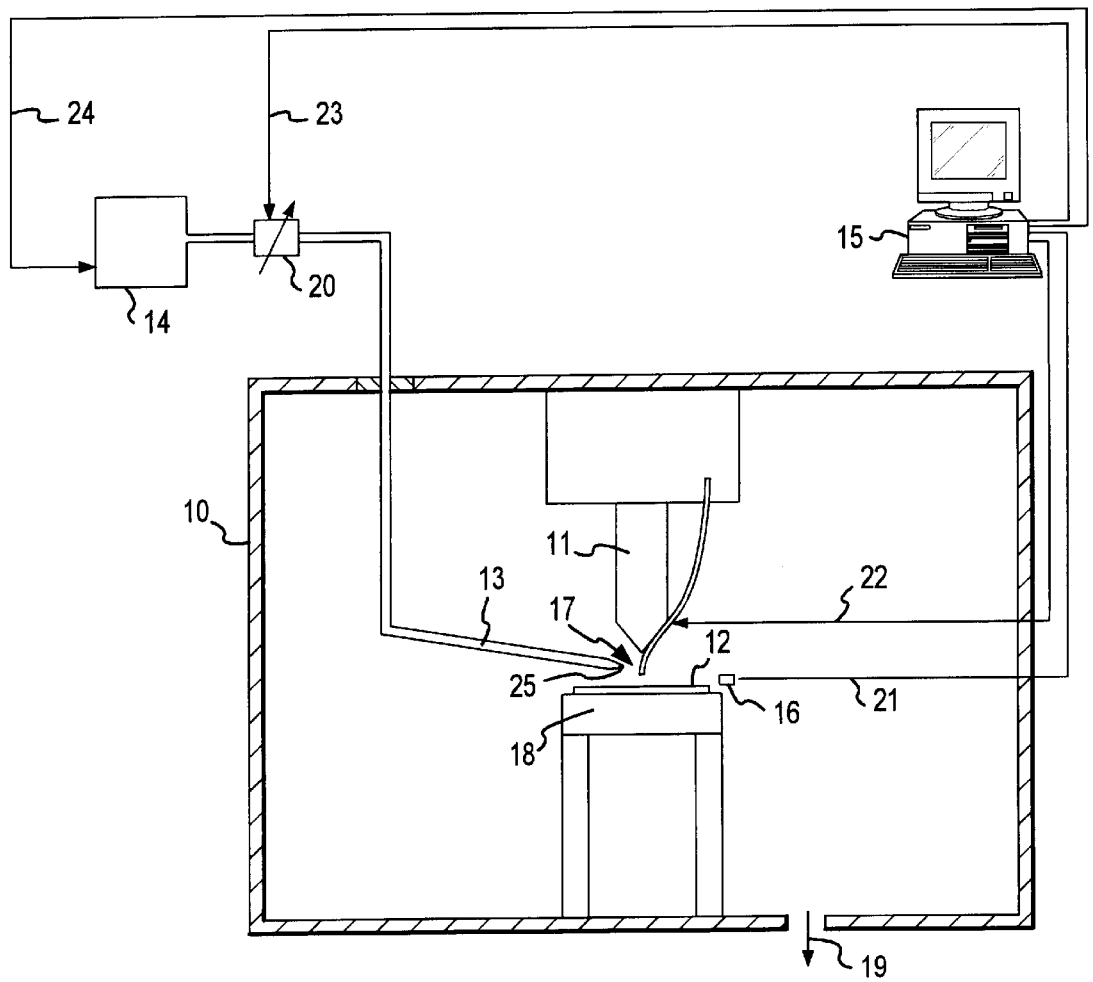
FIG. 1 is a schematic representation of a wire bonding chamber showing how formic acid vapor is used during copper wire bonding as a reducing agent.

FIG. 1 is a schematic representation of a wire bonding chamber 10 showing how formic acid vapor 17 is used during copper wire bonding as a reducing agent. A work piece 12 is typically a semiconductor chip 12 having structures defining circuit device elements, and includes one or more layers of metal interconnect that has one or more copper bonding pads to which wires are to be bonded. A wirebonding apparatus 11 is used to perform wire bonding operations. A conventional wirebonding apparatus 11 may be used with good results. The work piece 12 is held on a support 18. A processor or controller 15 is preferably provided to control wirebonding operations.

Preferably a nozzle 25 is provided connected to a conduit 13 for supplying formic acid vapor 17. The formic acid vapor preferably comprises a mixture of formic acid in gaseous form mixed with nitrogen gas, or any other suitable gas that is preferably inert in the chemical reactions of interest. The formic acid vapor 17 is supplied at a temperature between 150° C. and 360° C., and maintained at a reaction temperature within this range during wirebonding. A more preferred reaction temperature is between 150° C. and 250° C. An even more preferred reaction temperature range is between 190° C. and 210° C. A temperature sensor 16 is provided in close thermal relationship to the semiconductor chip 12, sufficiently thermally coupled to provide temperature readings closely approximating the reaction temperature at the surface of the pad to which a wire is being bonded. The controller 15 has a reaction temperature signal line 21 that provides temperature indication signals generated by the sensor 16 to the controller 15. The controller 15 preferably has a temperature control line 22 connected to a heater associated with the wire bonding apparatus 11 to control the temperature of the wirebonding operations.

The conduit 13 is in fluid communication with a flow control mechanism or controller 20 that measures the flow rate of the formic acid vapor 17, and also includes a valve for controlling flow rate. A signal and control line 23 is connected between the flow control mechanism 20 and the processor 15. The signal and control line 23 couples signals to the processor 15 generated by the flow control mechanism 20 indicative of the flow rate of the formic acid vapor 17, and also couples control signals from the processor 15 to the flow control mechanism 20 to control the rate of flow and concentration of the formic acid vapor 17.

The flow control mechanism 20 is in fluid communication with a source of formic acid vapor 14. The source of formic acid vapor 14 includes a heater 31 (not shown in FIG. 1). A heater sensor signal and control line 24 is provided between the processor 15 and the source 14. The heater sensor signal and control line 24 couples signals to the processor 15 indicative of the temperature of the formic acid, and also carries control signals from the processor 15 to the source 14 to control the heater 31 associated with the source 14.

Figure 2:
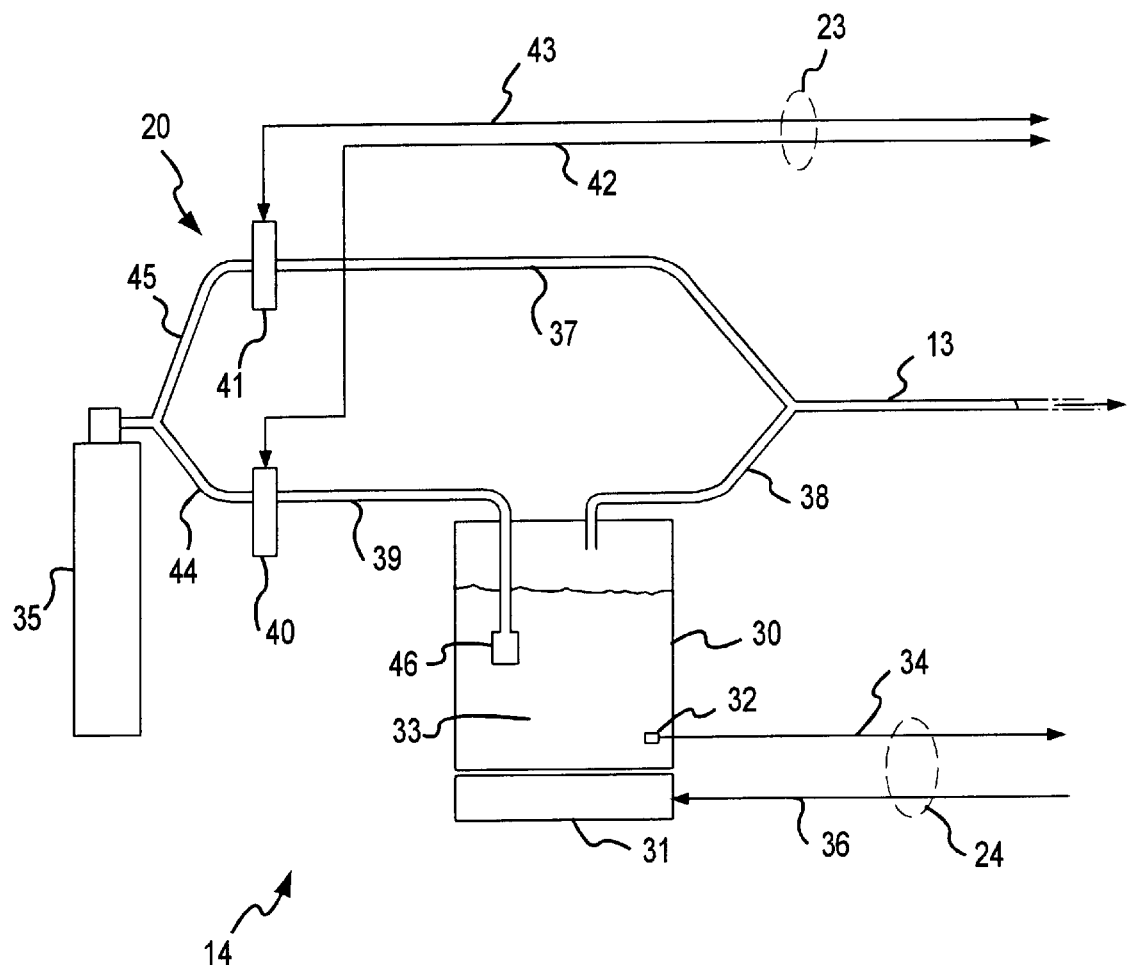
FIG. 2 is a schematic diagram showing further details relating to the source of formic acid vapor illustrated in FIG. 1.

Further details of the source 14 and the flow control mechanism 20 are shown in FIG. 2. A reservoir 30 of formic acid is provided. The reservoir 30 is heated by a heater 31. A temperature sensor 32 generates signals indicative of the temperature of the formic acid 33 in the reservoir 30, which signals are coupled to the processor 15 via temperature signal line 34. A temperature control line 36 between the processor 15 and the heater 31 couples control signals generated by the processor 15 to the heater 31 to control the temperature of the formic acid 33.

Flow rate may be controlled as shown in FIG. 2. A source 35 of inert gas such as nitrogen is provided. The nitrogen gas source 35 is in fluid communication with a first flow sensor-controller 40 via conduit 44. The first flow sensor-controlled 40 senses the flow rate of gas through the conduit 44 and generates a signal that is coupled to the processor 15 via a first flow signal control line 42. Control signals from the processor 15 are coupled to the first flow sensor-controller 40 via the first flow signal control line 42 to control a valve mechanism in the first flow sensor-controller 40 for increasing or decreasing the flow rate of the gas through the conduit 44. The first flow sensor-controller 40 is in fluid communication with the reservoir 30 through conduit 39. The conduit 39 is connected to a gas feed attachment 46 that is immersed in the formic acid 33 to allow nitrogen gas to bubble out of the attachment 46 into the formic acid 33. When the formic acid 33 is heated by the heater 31, formic acid vapor 17 is generated in gas form. The pressure provided by introduction of the nitrogen gas may be used to control the flow rate of formic acid vapor out of the reservoir 30 through a conduit 38.

The source of nitrogen gas 35 is also in fluid communication with a second flow sensor-controller 41 via conduit 45. The second flow sensor-controller 41 operates similarly to the first flow sensor-controller 40. The second flow sensor-controller 41 senses the flow rate of gas through the conduit 45 and generates a signal that is coupled to the processor 15 via a second flow signal control line 43. Control signals from the processor 15 are coupled to the second flow sensor-controlled 41 via the second flow signal control line 43 to control a valve mechanism in the second flow sensor-controller 41 for increasing or decreasing the flow rate of the gas through the conduit 45.

The second flow sensor-controller 41 is in fluid communication with the conduit 13 through conduit 37. The first flow sensor-controller 40 is in fluid communication with the conduit 13 via the conduit 38. The formic acid vapor flowing through the conduit 38 is mixed with nitrogen gas flowing through the conduit 37, and the mixture is provided through conduit 13 to the wire bonding chamber 10 as shown in FIG. 1. By adjusting the relative flow rates through the first sensor-controller 40 and the second flow sensor-controller 41, the concentration of formic acid vapor 17 supplied to the wirebonding chamber 10 may be controlled as desired.

In addition, the concentration of formic acid vapor introduced into the chamber 10 is also a function of the temperature of the formic acid 33 in the reservoir 30. Increasing the temperature of the formic acid 33 increases the vapor pressure. The temperature of the formic acid 33 is controlled by the heater 31, which in turn may be controlled by the processor 15. However, in a wirebonding application, the wirebonding temperatures are preferably in a narrow range. Therefore, the reaction rate is preferably controlled by adjusting the flow rate of the formic acid vapor, rather than by changing the temperature of the formic acid 33.

Formic acid vapor used in accordance with the present invention has a chemical formula that may be expressed as HCOOH, having two atoms of hydrogen, two atoms of oxygen, and one atom of carbon, per molecule. The reaction mechanism involved in this method of using formic acid vapor as a reducing agent in wirebonding operations may be stoichiometrically described, assuming a temperature greater than or equal to 200° C., as shown in Table 1, where "Me" is used as a generic symbol for a metal atom, such as copper Cu.

TABLE 1

$MeO + 2HCOOH = Me(COOH)_2 + H_2O$
$Me(COOH)_2 = Me + CO_2 + H_2$
$Me(COOH)_2 = Me + CO + H_2O$

As shown in Table 1, several reactions take place simultaneously. Some reactions produce carbon monoxide (CO), and other reactions produced hydrogen gas $H_2$. These reaction by-products can be used to further act as reducing agents during wirebonding. These additional reactions may be stoichiometrically described, assuming a temperature greater than or equal to 200° C., as shown in Table 2.

TABLE 2

$MeO + CO = Me + CO_2$
$MeO + H_2 = Me + H_2O$

Figure 3:
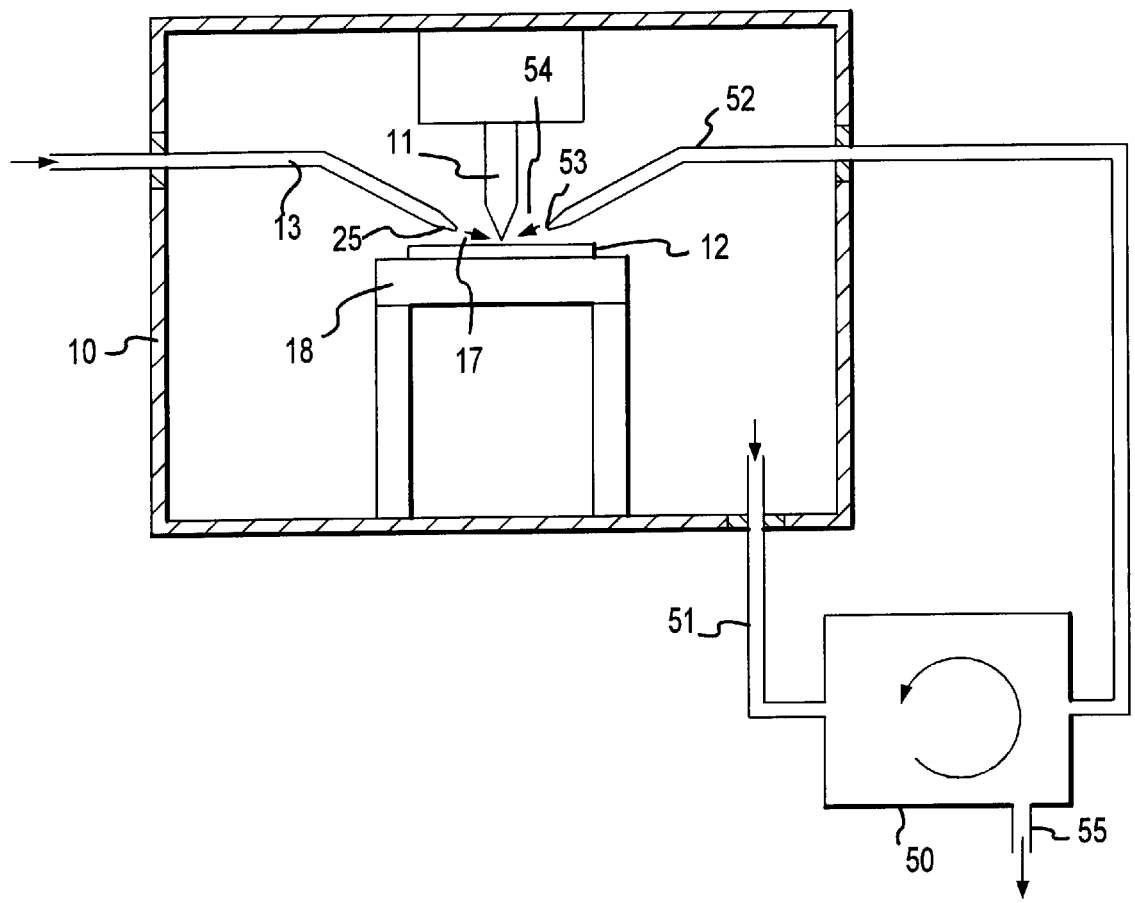
FIG. 3 is a schematic representation of a wire bonding chamber showing how reaction by-products are recirculated to further participate in reduction reactions with the formic acid vapor.

Thus, the CO and $H_2$ by-products may be advantageously recirculated to provide further reduction action in addition to the formic acid vapor. A suitable arrangement for recirculation of such by-products is shown in FIG. 3. In the illustrated embodiment, by-product gasses such as CO and $H_2$ flow through a conduit 51 to a recirculator 50, and return to the wirebonding chamber 10 via a conduit 52. The by-product gasses 54 are fed to the wirebonding apparatus 11 through a second nozzle 53. Alternatively, the recirculated by-product gasses may be combined with the formic acid vapor, and reintroduced into the wirebonding chamber 10 through the same nozzle 25. That is, the conduit 52 could be connected to the conduit 13. IN the embodiment illustrated in FIG. 3, gasses, such as $CO_2$ and $H_2O$, which do not further participate in reduction reactions, are preferably separated in the recirculator 50 and fed out through an exhaust conduit 55.

An advantage of using formic acid vapor as a reducing agent is that it decomposes at wirebonding temperatures of 200° C., so that it does not contaminate the semiconductor device 12. More specifically, when the temperature is greater than 150° C., the formic acid reacts with a metal oxide to form a kind of a compound (and water vapor), as described in the first equation in Table 1. When the temperature is 200° C. or greater, the compound further decomposes, as described in the second and third equations in Table 1. The second and third equations described in Table 1 are two co-existing pathways possible for the COOH decomposition.

The reaction rate as a function of the formic acid vapor concentration is generally an "S" shaped curve. For very low concentrations, the reaction rate is very slow. Once the concentration gets above a predetermined value, the reaction rate increases significantly in the middle range of concentrations. Above a predetermined value, saturation levels are reached, and the reaction rate flattens out providing very little increase in reaction rate for higher concentrations. In other words, the reaction rate changes dramatically in the middle range of concentrations, but the reaction rate does not change much in the extremely low and the extremely high concentration ranges. In the middle ranges, the reaction rate ratio is equal to the square of the concentration ratio.

A reaction temperature less than 360° C. is preferred, because at temperatures greater than 360° C. the formic acid is adversely affected, and is unstable. As used herein, the term "reaction temperature" is the temperature measured in the immediate vicinity of the semiconductor device 12 where wirebonding is to be performed.

The use of formic acid as a reducing agent is advantageous when the semiconductor device 12 has metal bonding pads that comprise at least 50% copper. A method according to the present invention is even more advantageous when the metal bonding pads comprise at least 75% copper. A method according to the present invention is especially advantageous when the metal bonding pads comprise at least 90% copper.

In the apparatus shown in FIG. 1, a fiber optic displacement sensor could be included as a supplementary device in the illustrated setup.

Those skilled in the art will appreciate, after having the benefit of this disclosure, that various modifications may be made to the specific embodiment of the invention described herein for purposes of illustration without departing from the spirit and scope of the invention. The description of a preferred embodiment provided herein is intended to provide an illustration of the principles of the invention, and to teach a person skilled in the art how to practice the invention. The invention, however, is not limited to the specific embodiment described herein, but is intended to encompass all variations within the scope of the appended claims.

We claim:

1. A method of manufacturing a semiconductor device, comprising:

providing a semiconductor chip having structures defining circuit device elements, the semiconductor chip including one or more metal bonding pads that comprise at least 50% copper;

exposing at least one of said bonding pads to formic acid vapor; and, bonding a wire to the bonding pad while the bonding pad is exposed to formic acid vapor or reaction products thereof.

2. The method of manufacturing according to claim 1, wherein:

one or bonding pads comprise at least 75% copper.

3. The method of manufacturing according to claim 1, wherein:

one or more bonding pads comprise at least 90% copper.

4. The method of manufacturing according to claim 1, further comprising the step of:

maintaining a reaction temperature between 150° C. and 250° C. during the bonding step.

5. The method of manufacturing according to claim 4, further comprising the step of:

controlling the concentration of formic acid vapor by mixing formic acid vapor with an inert gas prior to the exposing step.

6. The method of manufacturing according to claim 5, wherein:

the inert gas is nitrogen.

7. The method of manufacturing according to claim 4, wherein:

one or more bonding pads comprise at least 75% copper.

8. The method of manufacturing according to claim 4, wherein:

one or more bonding pads comprise at least 90% copper.

9. The method of manufacturing according to claim 5, further comprising the step of:

recirculating reaction by-product gasses to expose the bonding pad to said by-product gasses during the bonding step.

10. The method of manufacturing according to claim 5, wherein:

one or more bonding pads comprise at least 75% copper.

11. The method of manufacturing according to claim 5, wherein:

one or more bonding pads comprise at least 90% copper.

12. The method of manufacturing according to claim 1, further comprising the step of:

maintaining a reaction temperature greater than 190° C. during the bonding step.

13. The method of manufacturing according to claim 12, further comprising the step of:

controlling the concentration of formic acid vapor by mixing formic acid vapor with an inert gas prior to the exposing step.

14. The method of manufacturing according to claim 13, wherein the inert gas is nitrogen.

15. The method of manufacturing according to claim 13, further comprising the step of:

recirculating reaction by-product gasses in expose the bonding pad to said by-product gasses during the bonding step.

16. The method of manufacturing according to claim 1, further comprising the step of:

maintaining a reaction temperature between 150° C. and 360° C. during the bonding step.

17. The method of manufacturing according to claim 16, further comprising the step of:

controlling the concentration of formic acid vapor by mixing formic acid vapor with an inert gas prior to the exposing step.

18. The method of manufacturing according to claim 17, wherein:

the inert gas is nitrogen.

19. The method of manufacturing according to claim 17, further comprising the step of:

recirculating reaction by-product gasses to expose the bonding pad to said by-product gasses during the bonding step.

20. The method of manufacturing according to claim 1, further comprising the step of:

maintaining a reaction temperature between 190° C. and 210° C. during the bonding step.

21. The method of manufacturing according to claim 20, further comprising the step of:

controlling the concentration of formic acid vapor by mixing formic acid vapor with an inert gas prior to the exposing step.

22. The method of manufacturing according to claim 21, wherein:

the inert gas is nitrogen.

23. The method of manufacturing according to claim 21, further comprising the step of:

recirculating reaction by-product gasses to expose the bonding pad to said by-product gasses during the bonding step.

24. The method of manufacturing according to claim 9, wherein:

one or more bonding pads comprise at least 75% copper.

25. The method of manufacturing according to claim 9, wherein:

one or more bonding pads comprise at least 90% copper.

26. A method of manufacturing a semiconductor device, comprising:

making a semiconductor chip having structures defining circuit device elements, the semiconductor chip including a layer of metal interconnect that has one or more bonding pads that comprise at least 50% copper;

flowing formic acid vapor over one of said bonding pads to improve the bonding characteristics of the bonding pad;

bonding a wire to the bonding pad while formic acid vapor is flowing over the bonding pad; and, maintaining a reaction temperature greater than 150° C. during the bonding step.

27. The method of manufacturing according to claim 26, further comprising the step of:

maintaining a reaction temperature greater than 190° C. during the bonding step.

28. The method of manufacturing according to claim 26, wherein:

one or more bonding pads comprise at least 75% copper.

29. The method of manufacturing according to claim 26, wherein:

one or more bonding pads comprise at least 90% copper.

30. The method of manufacturing according to claim 27, wherein:

one or more bonding pads comprise at least 75% copper.

31. The method of manufacturing according to claim 27, wherein:

one or more bonding pads comprise at least 90% copper.

* * * * *